US008620251B2

(12) United States Patent
Mui et al.

(10) Patent No.: US 8,620,251 B2
(45) Date of Patent: Dec. 31, 2013

(54) ELECTRONIC DEVICE WITH ADJUSTABLE FILTER AND ASSOCIATED METHODS

(75) Inventors: Andrew Mui, Rochester, NY (US); Anthony Manicone, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 105 days.

(21) Appl. No.: 13/368,453

(22) Filed: Feb. 8, 2012

(65) Prior Publication Data

US 2013/0203367 A1    Aug. 8, 2013

(51) Int. Cl.
*H04B 1/00* (2006.01)
(52) U.S. Cl.
USPC .......... 455/307; 455/91; 455/130; 455/178.1; 455/306; 333/174; 333/176; 327/552; 327/553; 327/557; 327/558
(58) Field of Classification Search
USPC .......... 455/91, 120, 130, 178.1, 182.3, 191.1, 455/306, 307; 333/174, 176; 327/552, 553, 327/557, 558, 559, 562
See application file for complete search history.

(56) References Cited

U.S. PATENT DOCUMENTS

| 4,338,582 | A | 7/1982 | Presser | 333/175 |
| 7,289,784 | B2 | 10/2007 | Nam | 455/339 |
| 8,391,819 | B2 * | 3/2013 | Rajendran et al. | 455/307 |
| 2004/0219900 | A1 | 11/2004 | Zheng et al. | 455/302 |
| 2010/0285757 | A1 * | 11/2010 | Rofougaran et al. | 455/77 |
| 2010/0301956 | A1 * | 12/2010 | Nakamura | 331/117 FE |

OTHER PUBLICATIONS

Pedersen, Erik *"Performance Evaluation of CMOS Varactors for Wireless RF Applications"* RISC Group, Aalborg University.

* cited by examiner

*Primary Examiner* — Tuan Pham
(74) *Attorney, Agent, or Firm* — Allen, Dyer Doppelt, Milbrath & Gilchrist, P.A. Attorneys at Law

(57) ABSTRACT

An electronic device includes an adjustable filter with a first filter element, and a second filter element coupled to the first filter element. The second filter element includes a field effect transistor (FET) including a source terminal, a drain terminal, and a gate terminal. The source terminal and the gate terminal are coupled to a reference voltage. A control circuit is coupled to the drain terminal and is configured to apply a control voltage thereto to vary a capacitance between the source and drain terminals to adjust the adjustable filter.

15 Claims, 3 Drawing Sheets

ELECTRONIC DEVICE WITH ADJUSTABLE FILTER AND ASSOCIATED METHODS

FIELD OF THE INVENTION

The present invention relates to the field of electronic devices, and, more particularly, to electronic devices including adjustable capacitance elements and related methods.

BACKGROUND OF THE INVENTION

Wireless communication technology is evolving at an ever growing pace in order to meet the demanding performance characteristics of new mobile wireless communication devices. It is desired that these new mobile wireless communications devices are able to transmit data with a minimum amount of signal distortion.

There are two common types of transmitters employed in today's wireless infrastructures. In some transmitters an information signal (e.g. audio, video, etc.) modulates a radio frequency (RF) signal. This is known as direct modulation, and these direct modulation transmitters are relatively simple.

Other, more complicated transmitters are called superheterodyne transmitters. In a superheterodyne transmitter, the information signal first modulates an intermediate frequency signal. After stages for filtering and amplification, the intermediate frequency signal is converted to a RF signal by a frequency mixing stage. These superheterodyne transmitters are more complex than direct modulation transmitters, although they do provide numerous advantages.

When the intermediate frequency signal is converted to the RF frequency through a mixer, a variety of undesirable frequencies in addition to the desired frequencies are generated. The undesirable frequencies are based upon both the intermediate frequency and the information signal Common undesired signals include local oscillator feed through and the IF image frequency response. Subsequent stages, including filters, are used to remove these undesirable frequencies. When a given device is capable of transmitting at multiple frequencies, advanced filtering stages can be utilized to filter out the different undesirable frequencies corresponding to which transmit frequency is currently being employed.

For example, U.S. Pat. Pub. 2008/0287089 to Alles discloses an input filter for a superheterodyne receiver for image frequency suppression. The input filter includes a first filter circuit with bandpass characteristics and a center frequency. The first filter circuit has a varactor diode and a first filter inductor that are connected in parallel and form a parallel-resonant circuit, and the center frequency of the first filter circuit can be set by application of a control voltage to the varactor diode. The receiver also includes a second filter circuit with band stop characteristics that includes a varactor diode and a second filter inductor being connected in series and forming a series-resonant circuit.

Similarly, U.S. Pat. No. 7,221,924 to Zheng et al. discloses a superheterodyne receiver including a notch filter. The notch filter includes a varactor. Tuning of the varactor tunes the notch of the filter.

The filters in the above references may not provide the desired performance, because varactors may behave in a highly nonlinear fashion at higher frequencies, or may not be able to handle a desired amount of power, due to the overall small size of varactors. Consequently, new filter designs for electronic devices are required.

SUMMARY OF THE INVENTION

In view of the foregoing background, it is therefore an object of the present invention to provide an electronic device with an adjustable center frequency bandpass filter that may perform in a linear fashion at high input powers at high carrier frequencies.

This and other objects, features, and advantages in accordance with the present invention are provided by an electronic device that includes an adjustable filter comprising a first filter element, and a second filter element coupled to the first filter element. The second filter element comprises a field effect transistor (FET) including a source terminal, a drain terminal, and a gate terminal, the source terminal and the gate terminal being coupled to a ground reference voltage. A control circuit is coupled to the drain terminal and is configured to apply a control voltage thereto to vary a capacitance between the drain and source terminals to adjust the center frequency of the adjustable filter.

This use of a FET as a variable capacitance in the bandpass filter, as opposed to conventional circuit design which would teach the use of a varactor, helps to reduce nonlinear distortion. In addition, a FET is capable of handling more power before failure than a typical varactor due to its larger structure.

In some applications, the adjustable filter comprises an adjustable bandpass filter. Further, the first filter element comprises an inductor. In some applications, the first filter element comprises a capacitor. Additionally or alternatively, the FET comprises a source region underlying the source terminal, a drain region underlying the drain terminal, and a channel extending therebetween.

Radio frequency (RF) transmitter circuitry is coupled to the adjustable filter. The RF transmitter circuitry comprises an up converter and a power amplifier cooperating with the adjustable filter.

The radio frequency (RF) receiver circuitry is coupled to the adjustable filter. The RF receiver circuitry comprises a down converter and an amplifier cooperating with the adjustable filter.

A method aspect is directed to a method of forming an electronic device. The method includes forming an adjustable filter by coupling a first filter element to a second filter element, the second filter element comprising a field effect transistor (FET) comprising a source terminal, a drain terminal, and a gate terminal. The method also includes coupling the source terminal and gate terminals to a reference voltage, and coupling a control circuit to the drain terminal and configuring the control circuit to apply a control voltage to the drain terminal to vary a capacitance between the source and drain terminals to adjust the adjustable bandpass filter.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
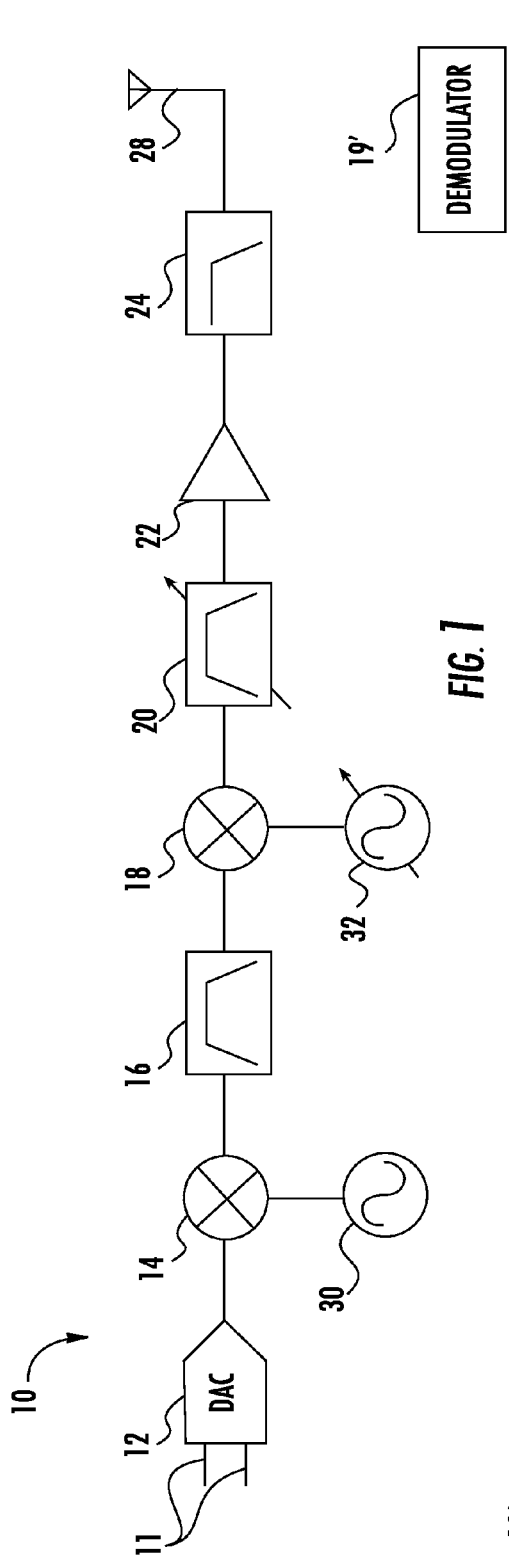
FIG. 1 is a schematic block diagram of an electronic device according to the present invention.

Referring initially to FIG. 1, an electronic device 10 is now described. The electronic device 10 illustratively comprises a transmitter, although it should be understood that the electronic device may also include other components, such as a receiver. The transmitter 10 is illustratively a superheterodyne transmitter, but may be any suitable transmitter, may operate in any suitable frequency band.

The baseband input signal is generated by the digital to analog converter (DAC) 12, which, in turn, is coupled to a second mixer 14. Also coupled to the second mixer 14 is a second local oscillator 30 so that the second mixer is driven to a fixed intermediate frequency.

The output of the second mixer 14 is in turn coupled to a fixed bandpass filter 16 so as to filter out undesired tones, phase noise, and spurious responses. The mixer 14 produces both sum and difference beat frequency signals, each one containing a copy of the desired signal. The frequencies at the output include the sum and difference frequencies as well as a number of undesirable frequencies which are 3rd and higher-order intermodulation products.

The fixed bandpass filter 16 selects the desired signal depending on design parameters, and is in turn coupled to a first mixer 18. A first local oscillator 32 is coupled to the first mixer 18 such that the first mixer is driven to a desired transmit frequency. The first local oscillator 32 is variable and can operate at a plurality of frequencies, enabling the electronic device 10 to function at a variety of transmit frequencies.

The first mixer 18 is coupled to a second filter 20, which will be described in detail below. This filter 20 is adjustable in center frequency so that it can deliver satisfactory performance at a variety of transmit frequencies, and is illustratively a bandpass filter. The first mixer 18 produces both sum and difference beat frequency signals, each containing a copy of the desired signal. The frequencies at the output include the sum and difference frequencies as well as a number of undesirable frequencies, such as the 3rd and higher-order intermodulation products. The adjustable bandpass filter 20 filters out either the sum or the difference frequency, leaving the desired frequency.

The adjustable bandpass filter 20 is coupled to a power amplifier 22, which is in turn coupled to a low pass filter 24 to filter out undesirable harmonic content generated by the power amplifier 22. The low pass filter 24 is coupled to the antenna 28 for transmission of the signal.

Figure 2:
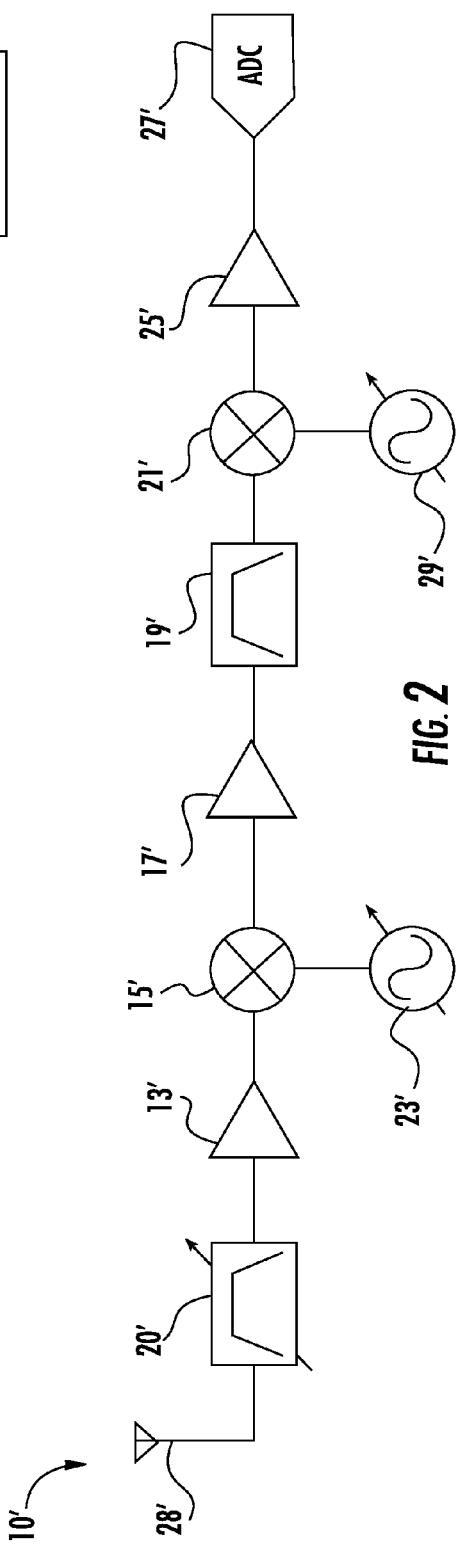
FIG. 2 is a schematic block diagram of another embodiment of an electronic device according to the present invention.

With reference to FIG. 2, another embodiment of the electronic device 10' is now described. Here, the electronic device 10' comprises a superheterodyne receiver, but may be any suitable receiver, may operate in any suitable frequency band. In addition, it should be understood that the electronic device 10' may include both the transmitter describe above and the receiver described below.

Indeed, the electronic device 10' includes an antenna 28' coupled to an adjustable bandpass filter 20', which will be described in detail below. The adjustable bandpass filter 20' is in turn coupled to an RF amplifier 13', which amplifies the received signal and is selectively tuned to pass a desired range of channels. The RF amplifier 13' is in turn, coupled to a mixer 15'. A variable local oscillator 23' is coupled to the mixer 15', which drives the mixer to a desired channel. Adjustment of the local oscillator 23' allows for different channels to be selected as will be understood by one of skill in the art.

A reason to convert to an intermediate frequency is to convert the various different frequencies of the stations to a common frequency for processing. Superheterodyne receivers such as the electronic device 10' tune in different stations simply by adjusting the frequency of the local oscillator 23' and processing thereafter is done at the same frequency, the intermediate frequency. Without using an intermediate frequency, the complicated filters and detectors in a radio would have to be tuned in unison each time the station was changed, which may not be desirable.

Yet a further reason for using an intermediate frequency is to improve frequency selectivity. In communication circuits, a common task is to separate out or extract signals or components of a signal that are close together in frequency. With most filtering techniques the filter's absolute bandwidth increases proportionately with the frequency. So, a narrower bandwidth and more selectivity can be achieved by converting the signal to an intermediate frequency and performing the filtering at that frequency.

The mixer 15' produces both sum and difference beat frequencies signals, each one containing a copy of the desired signal.

The output of the mixer 15' is coupled to an intermediate frequency amplifier 17', which is in turn coupled to a bandpass filter 19' which selects the desired signal and rejects the rest. The bandpass filter 19' is in turn coupled to a second mixer 21', which has a second local oscillator 29' coupled thereto to drive signal to a desired frequency. The second mixer 21' is in turn coupled to an amplifier 25', which then feeds the signal to an analog to digital converter (ADC) 27'. The ADC 27' samples the signal for further processing in the digital domain.

Figure 3:
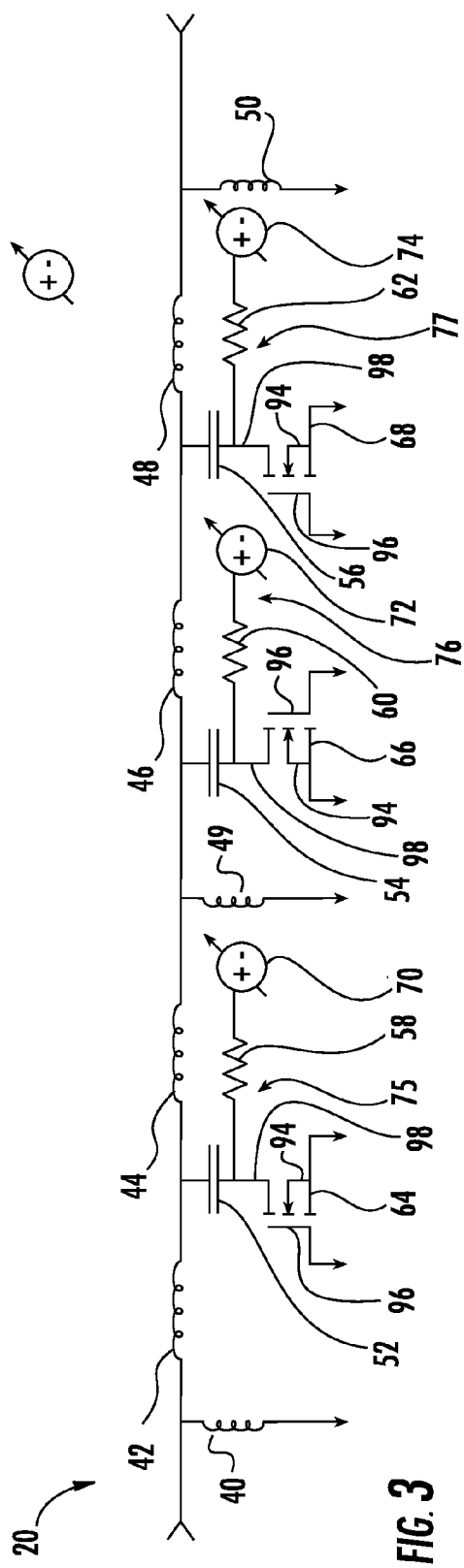
FIG. 3 is a circuit diagram of the bandpass filter such used in FIG. 1.

With reference to FIG. 3, the adjustable bandpass filter 20 is now described. The adjustable bandpass filter 20 comprises a plurality of inductors 40, 42, 44, 46, 48, 49, 50 and a plurality of capacitors 52, 54, 56 coupled thereto. The bandpass filter 20 further includes three FET's 64, 66, 68 coupled to the inductors 40, 42, 44, 46, 48, 49, 50 and capacitors 52, 54, 56.

The FET's 64, 66, 68 are illustratively NMOS transistors, but in other embodiments some or all thereof may instead be PMOS, or other types of insulated gate transistors.

Each FET 64, 66, 68 includes a source terminal 94, a drain terminal 98, and a gate terminal 96. The source terminal 94 and the gate terminal 96 are coupled to a reference or ground voltage. When biased this way, the capacitance between the source 94 and drain 98 terminals of the FETs 64, 66, 68 changes based upon a voltage applied to the non-grounded source/drain terminal.

Figure 4:
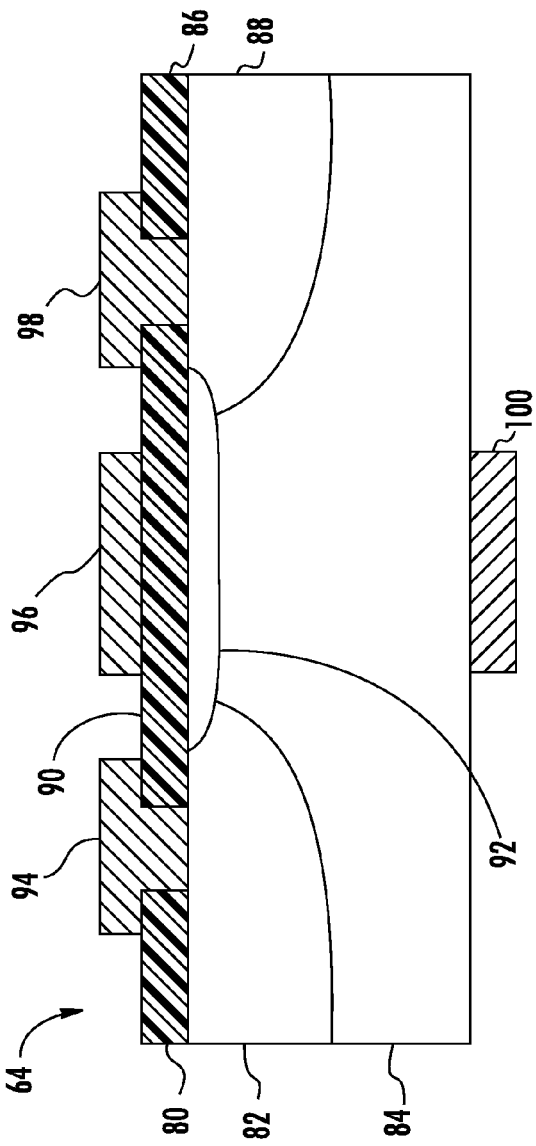
FIG. 4 is a cross sectional view of a field effect transistor of FIG. 3.

The structures of the FET 64 are now described with reference to FIG. 4, although it should be understood that the other FETs 66, 68 may have similar structures. The FET 64 comprises a source region 82, a drain region 88, and a doped substrate region 84 adjacent the source and drain regions. In operation, such as in a depletion mode or in an enhancement mode, a channel 92 extends between the source region 82 and drain region 88.

The source region 82, drain region 88, and doped substrate region 84 may be doped differently in different applications. Dielectric regions 80, 90, 86 are adjacent the source region 82, drain region 88, and channel 92. A gate terminal 96 is carried by the dielectric region 90. A source terminal 94 extends between the dielectric regions 80, 90 to contact the source 82. A drain terminal 98 extends between the dielectric regions 90, 86 to contact the drain 88. In operation, as the voltage across the source terminal 94 and drain terminal 98 increases, the width of a depletion region changes, and thus the capacitance between the source and drain terminals increases, as will be appreciated by those of skill in the art.

Referring again to FIG. 3, control circuits 75, 76, 77 are coupled to the source terminal of each FET 64, 66, 68. The control circuits 75, 76, 77 each comprise a resistor 58, 60, 62 coupled to a voltage source 70, 72, 74. The resistor 58, 60, 62 acts as a high impedance at the RF frequency, isolating the control circuit from the filter. By varying the voltage produced by the voltage sources 70, 72, 74 the capacitance between the source 94 and drain terminals 98 of the FETs 64, 66, 68 can be varied, thereby moving the poles of the adjustable bandpass filter 20 and enabling fine tuning thereof. Such an adjustable bandpass filter 20 allows the electronic device 10 to be able to transmit on different frequencies without additional bandpass filters, for example.

It should be understood that the voltage sources 70, 72, 74 are merely indicative of the existence of an applied voltage. Indeed, in some applications, the voltage sources 70, 72, 74 may be connections to a controller, for example.

The adjustable bandpass filter 20 herein is made particularly advantageous in comparison to prior art adjustable bandpass filters by the use of the FETs 64, 66, 68 as variable capacitance units. Prior art concerning adjustable bandpass filters generally use varactors. First, the FETs 64, 66, 68 performs more linearly than a varactor.

For example, a common measure of linearity of a filter is the $3^{rd}$ order output intercept point (OIP3). This is the output power at which the fundamental power is equal to the $3^{rd}$ order intermodulation power. Due to the fact that the capacitance between the source 94 and drain 98 terminals of the FETs 64, 66, 68 varies more linearly with voltage changes than does the capacitance of a varactor diode, the OIP3 of the adjustable bandpass filter 20 is 20 dBm at 225 MHz and 33.4 dBm at 273 MHz, which is greater than that of a prior art adjustable bandpass filter using varactors which measures 14.3 dBm at 225 MHz and 17.3 dBm at 273 MHz. In addition, the area of the FETs 64, 66, 68 is much larger than those of varactors, allowing the FETs, and consequently the adjustable bandpass filter 20, to handle more power before failure. Furthermore, one FET is suitable for use per each pole of the adjustable bandpass filter 20 as opposed to prior art adjustable bandpass filters that use two varactors per pole. This saves money and space by reducing the parts count.

Figure 5:
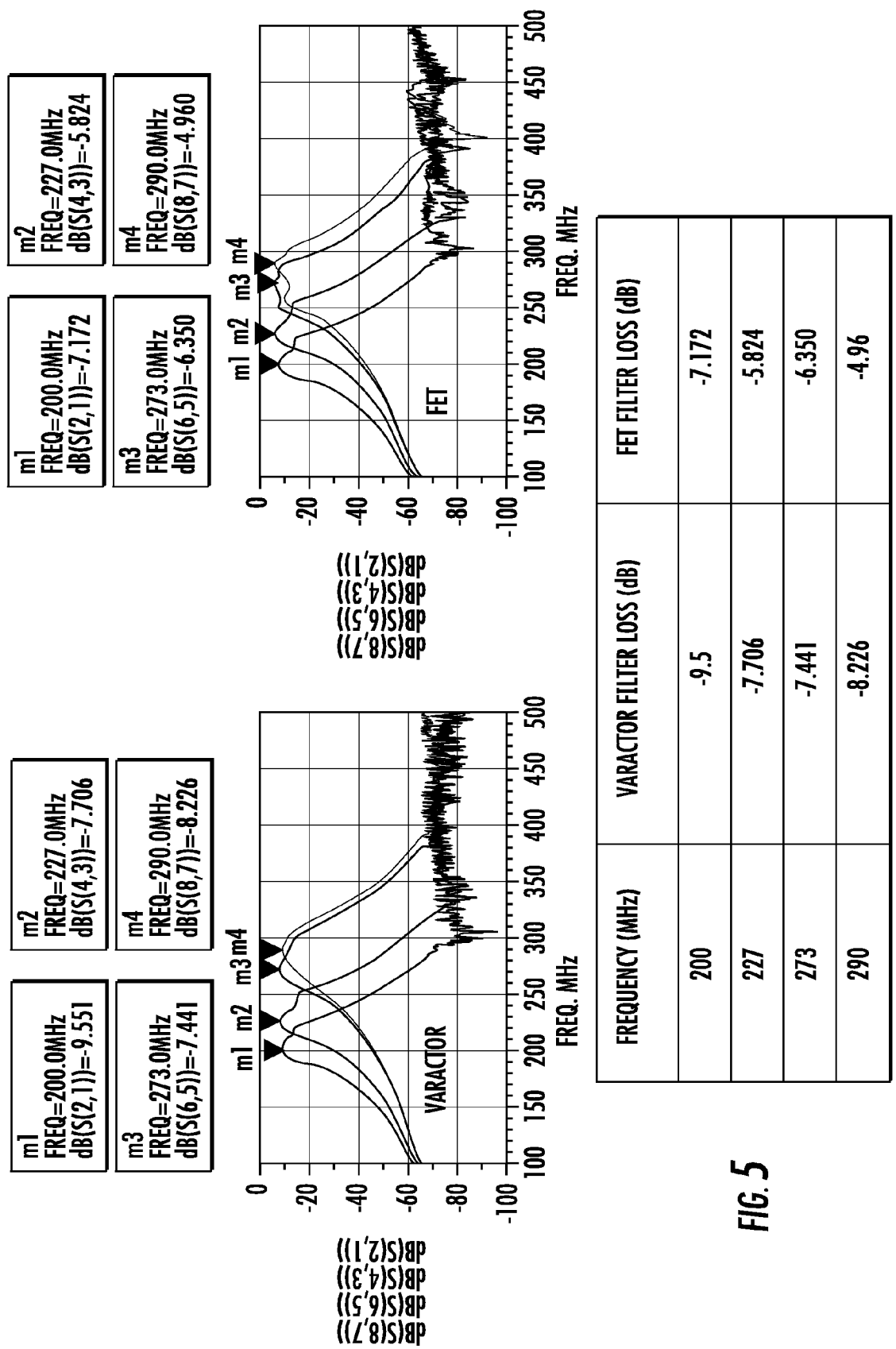
FIG. 5 shows the filter loss of the electronic device of FIG. 1 when using FETs as opposed to varactors.

To illustrate the advantage provided by the FETs 64, 66, 68 over a traditional varactor, attention is now drawn to FIG. 5, which graphs the filter losses of the adjustable bandpass filter 20 with the FETs 64, 66, 68, as well as a version of the adjustable bandpass filter with three varactors replacing the FETs 64, 66, 68. As shown in the accompanying chart, filter losses with the FETs 64, 66, 68 are less.

Those of skill in the art will appreciate that the invention includes suitable methods of making the electronic device 20 disclosed above.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
   an adjustable filter comprising
     a first filter element,
     a second filter element coupled to said first filter element, said second filter element comprising a field effect transistor (FET) comprising a source terminal, a drain terminal, and a gate terminal, said source terminal and said gate terminal being coupled to a reference voltage, and
     a control circuit coupled to said drain terminal and configured to apply a control voltage thereto to vary a capacitance between said source and drain terminals to adjust said adjustable filter.

2. The electronic device of claim 1, wherein said adjustable filter comprises an adjustable bandpass, bandstop, lowpass, or highpass filter.

3. The electronic device of claim 1, wherein said first filter element comprises an inductor.

4. The electronic device of claim 1, wherein said first filter element comprises a capacitor.

5. The electronic device of claim 1, further comprising radio frequency (RF) transmitter circuitry coupled to said adjustable filter.

6. The electronic device of claim 5, wherein said RF transmitter circuitry comprises an up converter and a power amplifier cooperating with said adjustable filter.

7. The electronic device of claim 1, further comprising radio frequency (RF) receiver circuitry coupled to said at least one adjustable filter.

8. The electronic device of claim 7, wherein said RF receiver circuitry comprises a down converter and an amplifier cooperating with said adjustable filter.

9. The electronic device of claim 1, wherein said FET comprises a source region underlying said source terminal, a drain region underlying said drain terminal, and a channel extending therebetween.

10. A radio frequency (RF) transmitter comprising:
    an adjustable filter comprising
      a first filter element comprising an inductor,
      a second filter element coupled to said first filter element, said second filter element comprising a field effect transistor (FET) comprising a source terminal, a drain terminal, and a gate terminal, said source terminal and said gate terminal being coupled to a reference voltage, and
      a control circuit coupled to said drain terminal and configured to apply a control voltage thereto to vary a capacitance between said source and drain terminals to adjust said adjustable filter; and
    transmitter circuitry cooperating with said adjustable filter.

11. The RF transmitter of claim 10, wherein said transmitter circuitry comprises an up converter and a power amplifier.

12. A radio frequency (RF) receiver comprising:
    an adjustable filter comprising
      a first filter element comprising an inductor,
      a second filter element coupled to said first filter element, said second filter element comprising a field effect transistor (FET) comprising a source terminal, a drain terminal, and a gate terminal, said source terminal and said gate terminal being coupled to a reference voltage, and
      a control circuit coupled to said drain terminal and configured to apply a control voltage thereto to vary a capacitance between said source and drain terminals to adjust said adjustable filter; and
    receiver circuitry cooperating with said adjustable filter.

13. The RF receiver of claim 12, wherein said receiver circuitry comprises a down converter and an amplifier cooperating with said adjustable filter.

14. An adjustable filter for an electronic device comprising:
   a first filter element;
   a second filter element coupled to said first filter element, said second filter element comprising a field effect transistor (FET) comprising a source terminal, a drain terminal, and a gate terminal, said source terminal and said gate terminal being coupled to a reference voltage; and
   a control circuit coupled to said drain terminal and configured to apply a control voltage thereto to vary a capacitance between said source and drain terminals to adjust the adjustable filter.

15. The adjustable filter of claim 14, wherein said first filter element comprises at least one of an inductor and a capacitor.

* * * * *